United States Patent
Blakes

(10) Patent No.: US 9,671,479 B2
(45) Date of Patent: Jun. 6, 2017

(54) METHOD AND APPARATUS FOR SHIMMING A SUPERCONDUCTING MAGNET

(71) Applicant: Hugh Alexander Blakes, Oxfordshire (GB)

(72) Inventor: Hugh Alexander Blakes, Oxfordshire (GB)

(73) Assignee: Siemens PLC, Camberley (GB)

( * ) Notice: Subject to any disclaimer, the term of this patent is extended or adjusted under 35 U.S.C. 154(b) by 796 days.

(21) Appl. No.: 13/963,250

(22) Filed: Aug. 9, 2013

(65) Prior Publication Data

US 2014/0043028 A1 Feb. 13, 2014

(30) Foreign Application Priority Data

Aug. 10, 2012 (GB) .................................. 1214311.1

(51) Int. Cl.
*G01R 33/3875* (2006.01)
*G01R 33/3815* (2006.01)

(52) U.S. Cl.
CPC ...... *G01R 33/3875* (2013.01); *G01R 33/3815* (2013.01)

(58) Field of Classification Search
CPC ............ G01R 33/3875; G01R 33/3815; G01R 33/421; G01R 33/34007; G01R 33/389; G01R 33/806; G01R 33/385; G01R 33/56518; H01F 6/006; H01F 6/008; H01F 5/00; H01F 6/003; H01F 6/02; H01F 6/06; Y02E 40/68
See application file for complete search history.

(56) References Cited

U.S. PATENT DOCUMENTS

| 4,535,291 | A | * | 8/1985 | Lee | G01R 33/3815 324/320 |
| 4,607,225 | A | * | 8/1986 | Crooks | G01R 33/3628 324/318 |
| 4,689,707 | A | * | 8/1987 | Schwall | H01F 6/006 335/216 |
| 4,816,962 | A | * | 3/1989 | Yamada | G01R 33/3815 335/216 |
| 4,994,935 | A | * | 2/1991 | Takechi | G01R 33/3815 361/141 |
| 5,329,266 | A | * | 7/1994 | Soeldner | G01R 33/421 324/319 |

(Continued)

*Primary Examiner* — Clayton E LaBalle
*Assistant Examiner* — Ruifeng Pu
(74) *Attorney, Agent, or Firm* — Schiff Hardin LLP

(57) ABSTRACT

In a method and apparatus for shimming a superconducting magnet that has a number of magnet coils electrically connected in series between a first current connection and a second current connection and a superconducting switch connected in parallel with the magnet coils, between the first current connection and the second current connection, with the first current connection being electrically connected to an external current lead, a first solid-state switching device is electrically interposed between the external current lead and the magnet coils; a number of superconducting shim coils electrically connected between the first current connection and the second current connection through a further solid-state switching device. Superconducting switches are each connected in parallel with a respective superconducting shim coil.

10 Claims, 5 Drawing Sheets

(56) References Cited

U.S. PATENT DOCUMENTS

| | | | |
|---|---|---|---|
| 6,014,069 A | 1/2000 | Havens et al. | |
| 6,977,571 B1* | 12/2005 | Hollis | G01R 33/288 |
| | | | 324/319 |
| 2007/0102422 A1* | 5/2007 | Thomas | H01F 6/003 |
| | | | 219/666 |
| 2008/0084262 A1* | 4/2008 | Beasley | G01R 33/3875 |
| | | | 335/216 |
| 2009/0212891 A1* | 8/2009 | Hickman | G01R 33/3815 |
| | | | 335/216 |
| 2010/0199765 A1* | 8/2010 | Retz | G01L 21/22 |
| | | | 73/579 |

* cited by examiner

(12) United States Patent
US 9,671,479 B2

METHOD AND APPARATUS FOR SHIMMING A SUPERCONDUCTING MAGNET

BACKGROUND OF THE INVENTION

Field of the Invention

The present application relates to the shimming of a magnetic field produced by a superconducting magnet.

Description of the Prior Art

Superconducting magnets are used to generate the homogeneous background fields required for magnetic resonance imaging (MRI). Such superconducting magnets need to be cooled to cryogenic temperatures, and so are located within cryostats. They are required to produce a magnetic field within an imaging region which is homogeneous to within a few parts-per-million. To achieve such homogeneity, shimming is required. Shimming involves the adjustment of the magnetic field generated by the bare magnet, typically by placing passive shims—typically ferromagnetic pieces such as plates of steel—between superconducting coils and the imaging region, or providing active shims—typically electromagnetic shim coils which carry a current adapted to correct inhomogeneity in the magnetic field.

SUMMARY OF THE INVENTION

FIG. 1 shows a conventional arrangement of a cooled superconducting magnet 10 within cryogen vessel 12, itself retained within an outer vacuum chamber (OVC) 14. One or more thermal radiation shields 16 are provided in the vacuum space between the cryogen vessel 12 and the outer vacuum chamber 14. In some known arrangements, a refrigerator 17 is mounted in a refrigerator sock 15 located in a turret 18 provided for the purpose, towards the side of the cryostat. Alternatively, a refrigerator may be located within an access turret 19, which retains access neck (vent tube) 20 mounted at the top of the cryostat. The refrigerator provides active refrigeration to cool cryogen gas, typically helium, within the cryogen vessel 12, in some arrangements by recondensing it into a liquid 22. The refrigerator may also serve to cool the radiation shield 16. As illustrated in FIG. 1, the refrigerator 17 may be a two-stage refrigerator. A first cooling stage is thermally linked to the radiation shield 16, and provides cooling to a first temperature, typically in the region of 80-100K. A second cooling stage provides cooling of the cryogen gas to a much lower temperature, typically in the region of 4-10K.

A negative current connection 21a is usually provided to the magnet 10 through the body of the cryostat. A positive current connection 21 is usually provided by a conductor passing through the vent tube 20.

An external current lead 34 may be provided to allow electrical connection between external equipment and the positive current connection 21. In some designs, both positive and negative external current leads are provided, electrically connected to positive current connection 21 and negative current connection 21a respectively. In some arrangements, fixed external current leads are provided, which remain in place when the magnet is operating. In other embodiments, demountable external current leads are provided, which are removed once current has been introduced satisfactorily into the magnet. If fixed external current leads are used, steps should be taken to minimize the resulting thermal load. If demountable external current leads are provided, care must be taken during the attachment and removal of the external current leads to minimize contamination by air ingress.

In alternative arrangements, no cryogen vessel 12 is provided, but instead the magnet 10 is cooled either by conduction through a solid thermal bus to the refrigerator 17, or a cooling loop arrangement is provided, in which a tube is placed in thermal contact with the magnet, and cooled cryogen circulates in the tube, from the refrigerator, picking up heat from the magnet, and back to the refrigerator.

A gradient coil assembly 30 is provided within the bore of the OVC 14. The gradient coil assembly contains electromagnetic coils arranged to generate orthogonal oscillating magnetic field gradients within imaging region 32. Arrangements are conventionally provided for locating passive shims or resistive shim coils within the gradient coils assembly. In systems where superconducting shim coils are used, these are located within the cryostat.

The illustrated example is a cylindrical magnet, in which superconductive coils are axially aligned along axis A-A. The present invention may be applied to such cylindrical magnets, and also to magnets of other geometries, such as open C-shaped magnets.

It is important to minimize the amount of heat which can leak into the OVC and reach the magnet, as refrigerators tend to be capable of only modest cooling power at the cryogenic temperatures required for superconduction.

The three conventional methods of shimming can be compared as follows:

1. Passive shimming involves adding pieces of iron in precisely calculated quantities and at precisely calculated locations in the bore of the magnet to distort the field. This method becomes more impractical as field strengths increase as the iron saturates and large quantities are required. The iron may be heated by the gradient coil and very precise temperature control may be required to compensate. This is at present a limiting factor in attainable temporal homogeneity.

2. Resistive shim coils may be placed within the gradient coil assembly and require significant power. They must be cooled along with the gradient coils and will render the stability of the homogeneity of the magnetic field in the imaging region dependant on the stability of the shim coil power supply. Advantageously, the current in the coils can be adjusted during use but as higher field strengths are used, the number of ampere-turns required tends towards the impractical.

3. Superconducting shim coils may be added inside the cryostat along with the magnet. This method solves most of the problems associated with the preceding solutions but requires either many demountable current leads to the exterior of the OVC with all the associated problems of ice ingress and reliability, or fixed external current leads which introduce extra complexity and a large conduction-mode heat leak. Such arrangements are also not adjustable by a user, so that any change in shimming requires a service visit, with the associated cost and delay that involves. Depending on the arrangement, a separate shim power supply or supplies are typically required in order to provide the energization current.

FIG. 2 shows an electrical circuit diagram of a typical superconducting magnet for MRI imaging. Superconducting coils 10 are connected in series between a positive connection 21, which may include a fixed current lead (FCL) 34 within the turret 19, and a negative connection 21a, which may be earthed 37 to the OVC 14. A superconducting switch 36 of conventional construction is connected across the superconducting magnet coils 10. As is well known, the superconducting switch 36 consists of a piece of superconductive wire in a resistive matrix material, and a controlled heater 38. By applying energy to the heater, the piece of superconductive wire quenches, and becomes resistive. The switch is "turned OFF". When the resistor 38 is de-energized, the piece of superconducting wire cools, and returns to its superconducting state. The switch is "turned ON". Inverse-parallel connected diodes 40 are connected across the switch 36, and serve to protect the switch from excessive voltages which might otherwise occur when the switch is opened.

As is well known, the magnet coils 10 are energized by turning switch 36 OFF, ramping a current through connections 21, 21*a* until a desired magnet current is reached, and then turning the switch 36 ON. The current then circulates in a closed superconducting circuit comprising the coils 10 and the switch 36. A magnet power supply used to provide the current for the coils 10 may now be removed. The current remains persistent until switch 36 is turned OFF.

To remove current from the magnet, a magnet power supply 39 including a diode run-down load 41, as shown in FIG. 5, is connected between the positive and negative connections 21, 21*a*. The heater 38 is energized to turn the switch 36 OFF. Current then flows through the magnet power supply 39 which includes a diode run-down load 41 to dissipate power and reduce current in the magnet. Once the current in the magnet reaches zero, the magnet power 39 supply may be disconnected. The diode run-down load 41 typically consists of a string of about ten forward-biased power diodes in series. A constant voltage is maintained across the string of diodes, and power is dissipated in the diodes. A diode run-down load 41 is preferred to a resistive load due to the essentially constant voltage that is maintained across the load, and that the diode load reduces the current through it to zero, while a resistive load will not result in zero current.

Only three magnet coils 10 are shown in FIG. 2 for clarity of illustration, but rather more than three coils are typically provided.

FIG. 3 illustrates an electrical schematic diagram of a conventional arrangement of a superconducting magnet as represented in FIG. 2 provided with a number of superconducting shim coils 42. Each of the shim coils 42 is provided with a superconducting switch 44 connected in parallel. The operation of these superconducting switches is the same as explained for superconducting switch 36 above and are used for independently energizing each of the associated shim coils in the same manner as described above for the magnet coils 10. Each superconducting shim coil 44 is provided with a current supply lead 46 and a lead 48 for energizing the associated resistor 50, with a common return path to ground 14. This means that many wires need to be passed out of the OVC. Of these, the shim current supply leads 46 need to be relatively thick, as they may need to carry a current of 20 A or so. They will therefore represent a significant heat leakage path into the OVC. The leads 48 used to energize the resistors 50 need only carry a relatively small current, and may be of thin wire, representing a less significant heat leak into the OVC.

Either fixed current leads are provided for the shim coils, representing a significant heat leak, or demountable current leads are provided, which prove difficult in operation due to contamination.

In operation, the magnet coils 10 are energized with a desired level of current, and the homogeneity of the resultant magnetic field in the imaging region 32 is measured. A computer simulation is then performed to calculate currents which when applied to respective shim coils 42 will improve the homogeneity of the magnetic field in the imaging region. Typically, then, a power supply, which may be the magnet power supply as used to introduce current into the magnet coils 10, is electrically connected to each of the superconducting shim coils in turn. The respective superconducting switch 44 is opened by energizing resistor 50 through respective lead 48, and current introduced until the desired current is achieved for that shim coil. The corresponding superconducting switch 44 is then closed by de-energizing resistor 50, and the procedure repeated for each of the other superconducting shims.

FIGS. 4A, 4B shows another conventional arrangement of superconducting shim coils in a superconducting magnet. Features corresponding with features in earlier drawings carry corresponding reference numerals. This arrangement differs from the arrangement of FIG. 3 in that the superconducting shim coils 42 are connected in series, with superconducting switches 44 connected in parallel with each superconducting shim coils. A single shim coil external current lead 52 is provided, to allow a power supply to supply current to the series connection of shim coils. This represents a significant heat leak. To introduce desired currents into each of these shim coils, all of the superconducting switches 44 in parallel with the shim coils are turned ON, except one. One of the switches 44 is turned OFF, and the shim coil 42 in parallel with that one switch is the one whose current is to be adjusted. Each of the other superconducting shim coils 42 forms a closed superconducting loop with its superconducting switch.

For example, as shown in FIG. 4B, superconducting switches $44_1$ and $44_2$ form closed superconducting circuits with their respective superconducting shim coils $42_1$ and $42_2$. Superconducting switch $44_3$ is open. Any current which is passed through shim coil current lead 52 will flow through shim coil $42_3$ and, due to the inductance of the other shim coils, through superconducting switches $44_1$ and $44_2$. Then the current flowing in shim coil current lead 52 and so also in superconducting shim coil $42_3$ reaches the desired value, superconducting switch $44_3$ is switched ON, and the current is removed from shim coil current lead 52. Each of the shim coils 42 then carries a respective current flowing in a closed loop through the associated superconducting switch 44.

The conventional method for active shimming using superconducting coils, as described above, suffers from certain drawbacks. The arrangement of FIG. 3 suffers from heat leakage or difficulty in use of demountable current leads. The arrangements of FIGS. 4A-4B also suffer from heat leakage through the fixed current lead, and additionally risk degrading the whole system if a single coil or switch fails, as the whole shimming circuit will be affected.

SUMMARY OF THE INVENTION

The present invention concerns a method and an apparatus for shimming a superconducting magnet that has a number of magnet coils electrically connected in series between a first current connection and a second current connection, and a first superconducting switch connected in parallel with the magnet coils, between the first current connection and the second current connection, and wherein the first current connection is electrically connected to a fixed current connection. In accordance with the present invention, a first solid-state switching device is connected between the external current lead and the magnet coils. A number of superconducting shim coils are connected between the first current connection and the second current connection to a further solid-state switching device. Each of further superconducting switches is connected in parallel with a respective superconducting shim coil. The first solid-state switching device is turned on and the further solid-state switching device is turned off, and the first superconducting switch is turned off. Current is introduced into the magnet coils through the external current lead and the second current connection. The first superconducting switch is then turned on, the first solid-state switching device is turned off, a selected further solid-state switching device is turned on, and a selected one of the further superconducting switches is turned off, in parallel with a selected shim coil, that is in series with the selected further solid-state switching device. A desired current is then introduced into the selected shim coil through the external current lead and the second current connection. The selected further superconducting switch is turned on. The last four steps are repeated for each of the superconducting shim coils.

DESCRIPTION OF THE PREFERRED EMBODIMENTS

Figure 1:
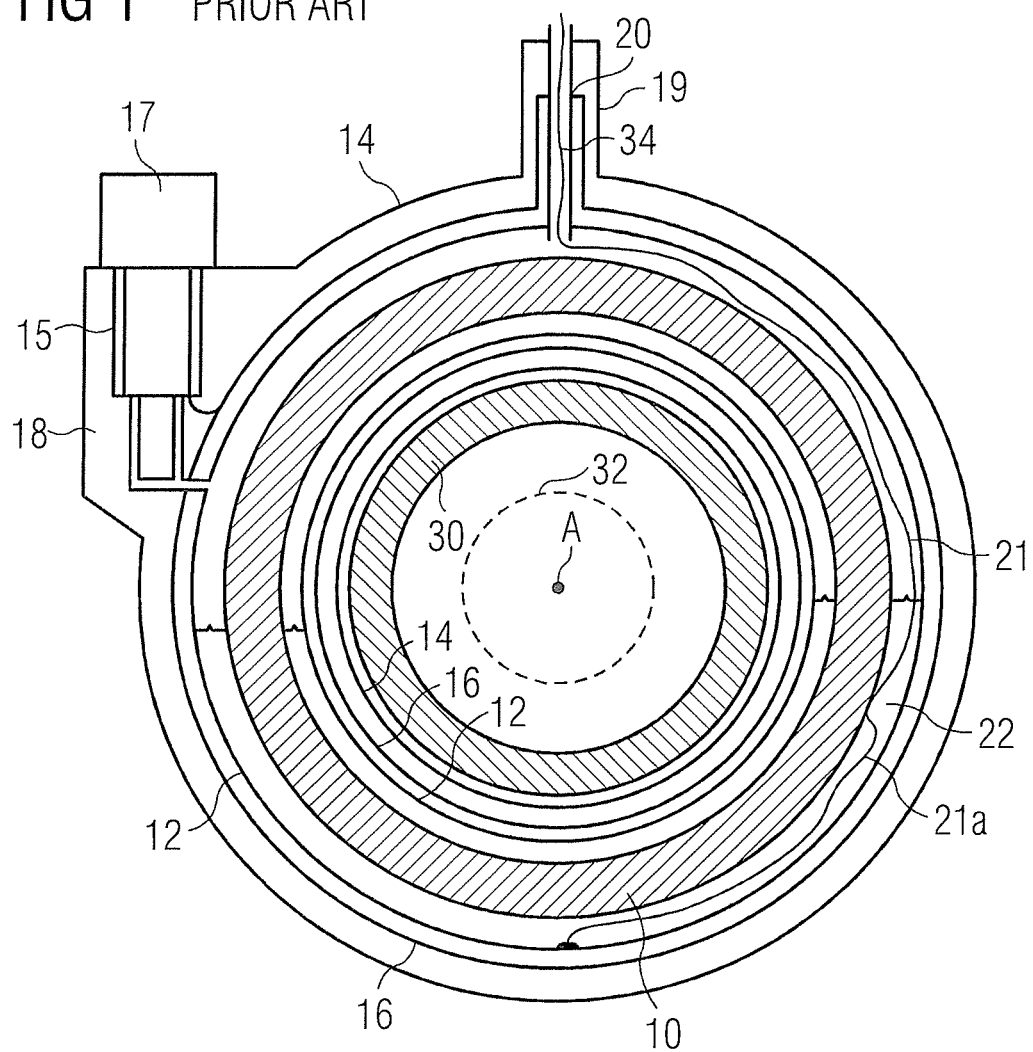
FIG. 1 illustrates a radial cross-section through a conventional superconducting magnet which may benefit from the present invention.
Figure 2:
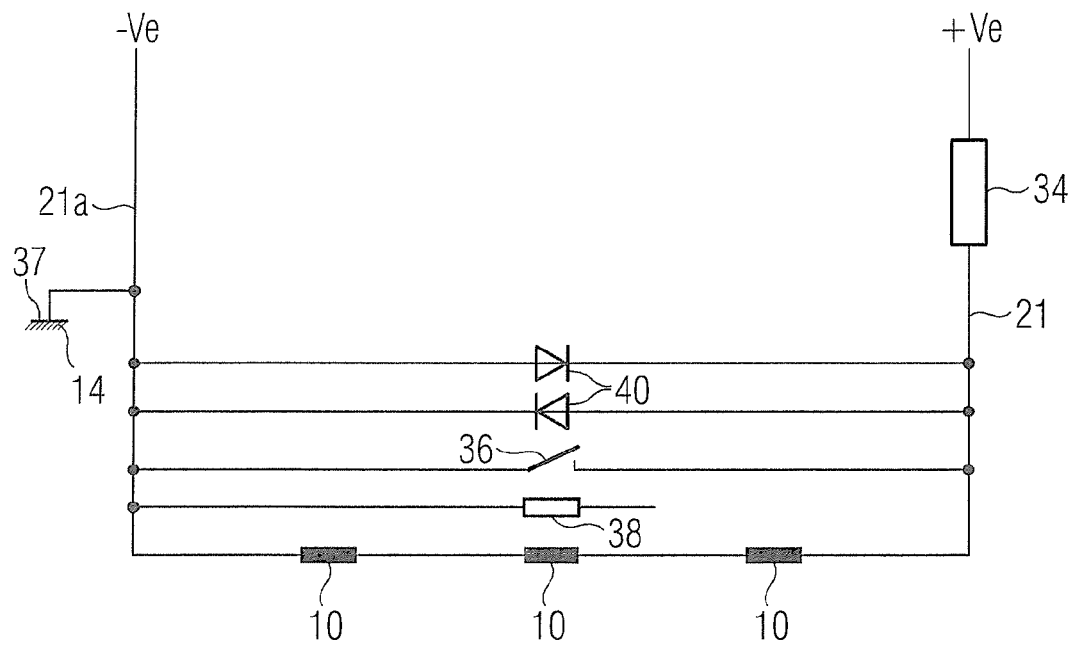
FIG. 2 shows an electrical schematic diagram of a conventional superconducting magnet for an MRI system.
Figure 3:
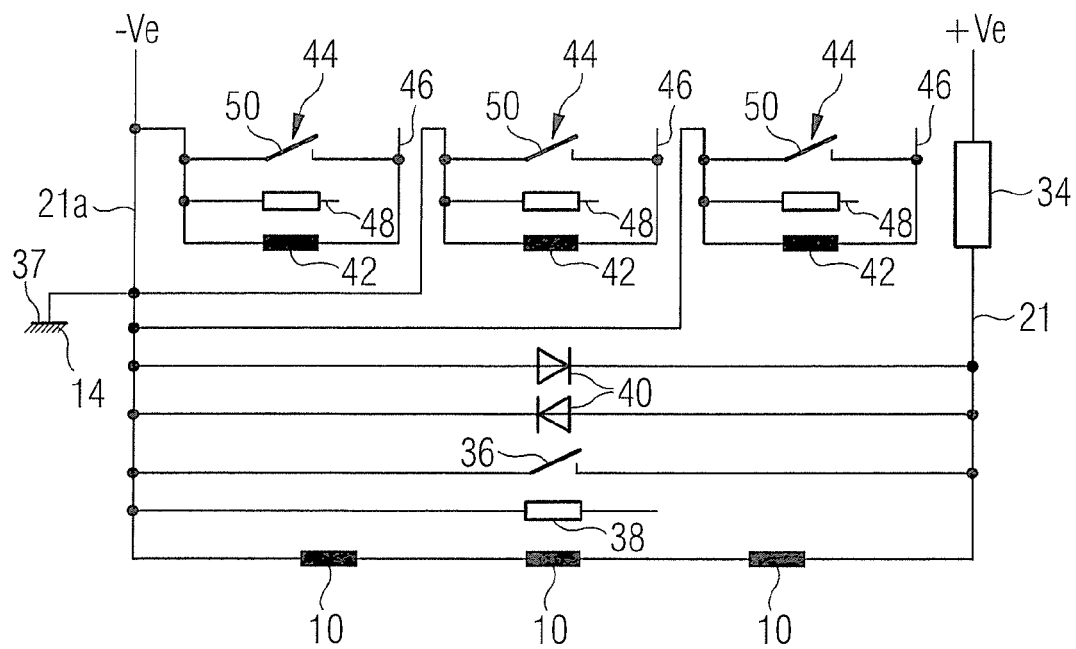
FIG. 3 shows a conventional electrical schematic diagram for superconducting shim coils within a superconducting magnet such as illustrated in FIG. 2.
Figure 4A:
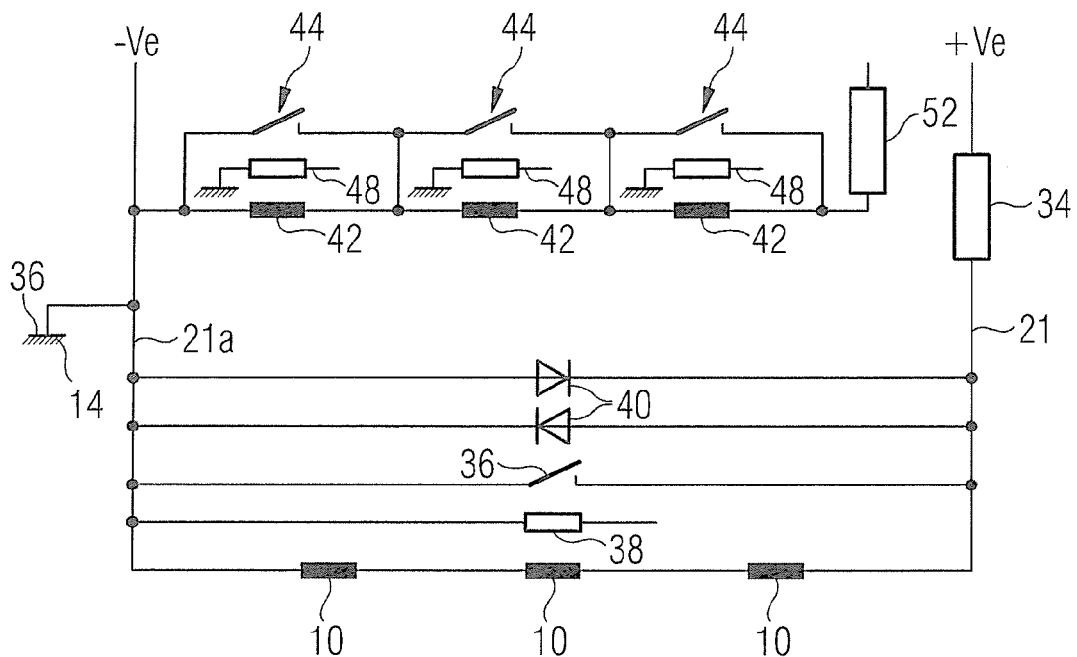
FIGS. 4A-4B show another conventional electrical schematic diagram for superconducting shim coils within a superconducting magnet such as illustrated in FIG. 2.
Figure 4B:
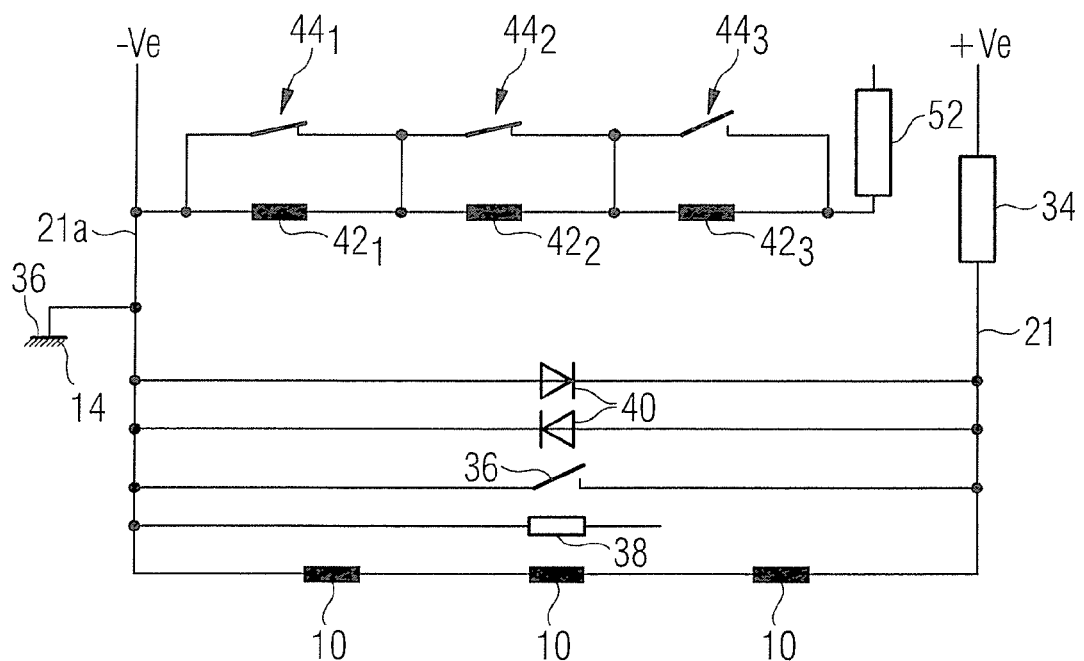
Figure 5:
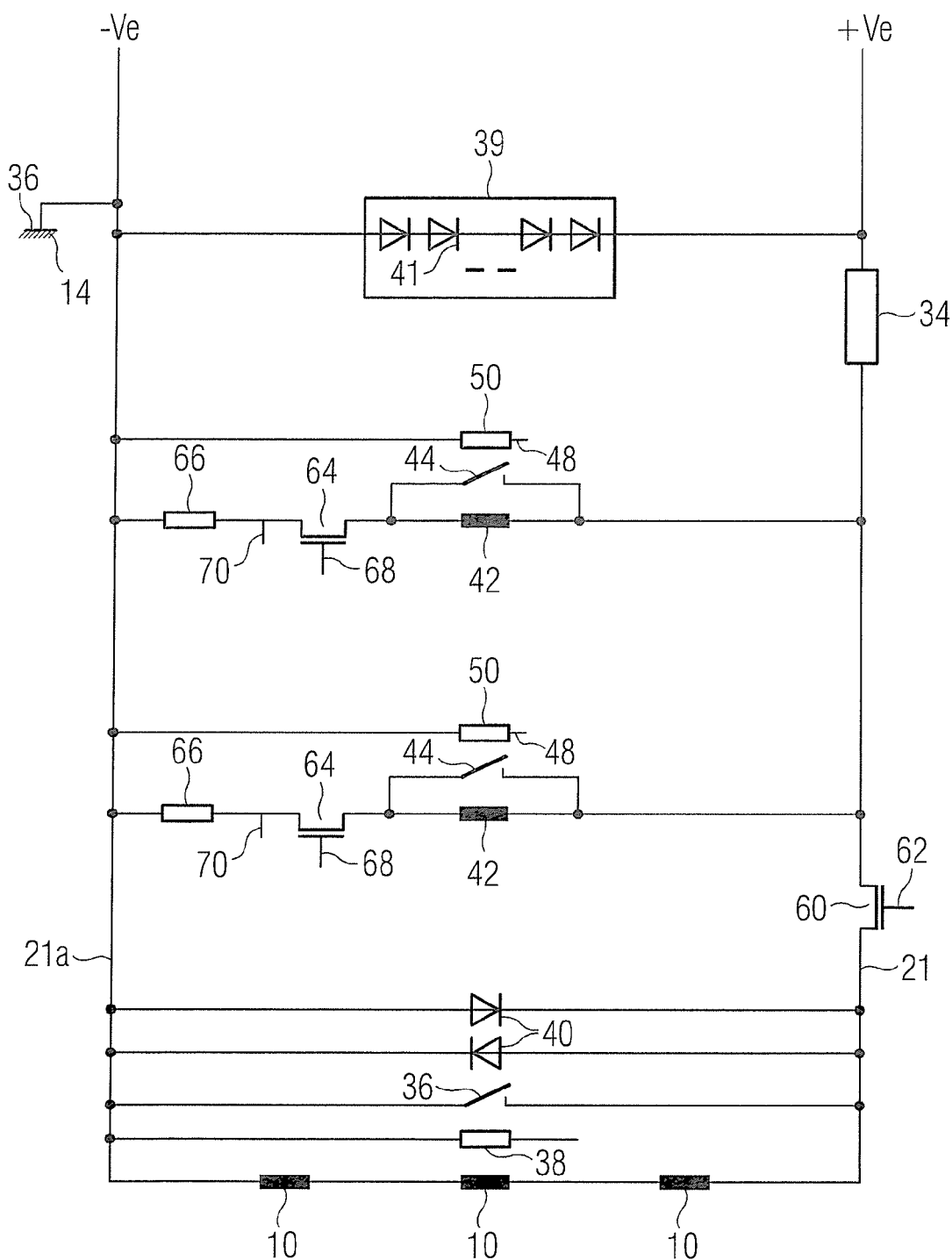
FIG. 5 illustrates an electrical schematic of an embodiment of the present invention, in which superconducting shim coils are employed.

FIG. 5 illustrates an electrical schematic of an embodiment of the present invention. Features corresponding to features of earlier drawings carry corresponding reference numbers. According to a feature of the present invention, a solid-state switching device 60 such as a power MOSFET is provided in series between the magnet coils 10 and the external current lead 34. As discussed above, the external current lead 34 may be a fixed current lead or a demountable current lead. A control terminal 62, such as the gate of a power MOSFET, is provided to receive a switching control signal. A connection, connected to control terminal 62, may lead out of the OVC. While this will represent a thermal leakage path, the connection need only be very thin, and so would represent an insignificant heat leak.

According to another feature of the present invention, the superconducting shim coils 42 are connected to receive current from the same external current lead 34 as used to supply current to the magnet coils. Only two shim coils 42 are shown for clarity, although it is envisaged that rather more than two would be provided in any particular superconducting magnet for MRI imaging. Typically, from twelve to eighteen could be expected.

Each superconducting shim coil 42 is connected in a series arrangement with a respective solid-state switching device 64, such as a power MOSFET, and preferably also a current sense resistor 66. Each series arrangement is connected between the positive current connection 21 and the negative current connection 21a.

In this embodiment of the present invention, the various superconducting shim coils 42 may be energized sequentially, or simultaneously. The magnet coils 10 are disconnected from external current lead 34 by opening solid-state switching device 60.

For sequential energization, one of the shim coils is selected for energization. The corresponding solid-state switching device 64 is turned ON by application of an appropriate voltage on a control terminal, while the solid-state switching devices 64 of the other shim coils are turned OFF. The corresponding superconducting switch 44 is turned OFF by energization of the corresponding resistor 50 through lead 48. Current is then introduced through current lead 34 and flows through the selected shim coil. Once the desired level of current is reached, as indicated by the power supply used, or otherwise, the corresponding superconducting switch 44 is turned ON, and the current may be removed from current lead 34. A similar sequence can be applied to each of the other superconducting shim coils in turn, until the required current levels have been introduced into each shim coil. In this method, all of the solid-state switching devices 60, 64 are used in switching mode—that is, the voltages applied to their control terminals 62, 68 render then either "on" or "off".

Typical magnet power supplies are able to provide very precise currents, over a wide range. In some embodiments, the solid-state switching device 64 is turned ON, and the appropriate current is supplied from a magnet power supply, suitably instructed. An advantage of such an arrangement is that only a single power supply is required, both for introducing current into the magnet, and for introducing current into the superconducting shims.

Some solid-state switching devices, such as power MOSFETs may alternatively be used in a linear mode, such that the conductance of the device may be controlled in an analogue manner between a high-conductance "on" state and a low-conductance "off" state. Such mode of operation may be used with the embodiment of the invention illustrated in FIG. 5, to enable simultaneous energization of several shim coils from a single external current lead.

Once the magnet coils 10 have been energized, and their magnetic field measured, switching device 60 is opened to isolate the magnet coils 10 from the current lead 34. Appropriate shim currents are calculated for respective shim coils, and may now be introduced into the superconducting shim coils 42.

In an example method, simultaneous energization of multiple shim coils 42 in an arrangement such as shown in FIG. 5 may be performed. All superconducting switches 44 parallel with shim coils 42 to be energized are turned OFF. An appropriate voltage is applied to the current lead 34. Appropriate control voltages are applied to the control terminals 68 of solid-state switching devices 64 concerned, in order to distribute current flowing in the current lead 34 between the shim coils 42 as required. For each shim coil 42, a current sense resistor 66 is provided, along with a current sense lead 70. By measuring the voltage at the current sense lead 70—that is, the voltage across the current sense resistor 66, the amount of current flowing in the associated shim coil 42 can be monitored. When a required level of current is indicated in a particular shim coil 42, the corresponding superconducting switch 44 is turned ON by de-energizing the corresponding resistor 50. Any further variation in current will pass only through the superconducting switch 44 and not the shim coil 42. The conductances of all solid-state switching devices 64 may be adjusted concurrently while maintaining an appropriate current flowing through current lead 34 by adjusting the conductances of the solid-state switching devices in their analogue mode of operation so that the current flowing in all shim coils can be set simultaneously.

Typical magnet power supplies are able to provide very precise currents, over a wide range. Such a magnet power supply may be employed to generate a required total superconducting shim coil current, with the conductances of solid-state switching devices 64 being adjusted to achieve a desired current distribution between the superconducting shim coils. An advantage of such an arrangement is that only a single power supply is required, both for introducing current into the magnet, and for introducing current into the superconducting shims.

In this way, the currents in the shim coils 42 may be set simultaneously, providing very rapid shimming. Only two thin wires are required for each shim coil: for the control signal applied to control terminal 68 of each solid-state switching device 64, and current sense lead 70. A single superconducting switch control lead 48 may be shared by all shim coils. Simultaneous adjustment is advantageous in that it avoids coupling of the various coils which may occur during sequential adjustment.

Such coupling may mean that the sequence has to be repeated in an iterative fashion until all shim coil currents are set correctly. This may take many hours or even days of detailed measurements and adjustments, while the present invention allows shimming to be completed in a much shorter time.

On the other hand, it may be necessary to fix current(s) in one or more of the shim coils 42 and then adjust currents in other shim coils after a slight delay. If some shim coils require current flowing in an opposite sense from current in certain other shim coils, it will be necessary to set the shim coil currents in two distinct phases—corresponding to the two directions of current flow.

Figure 6:
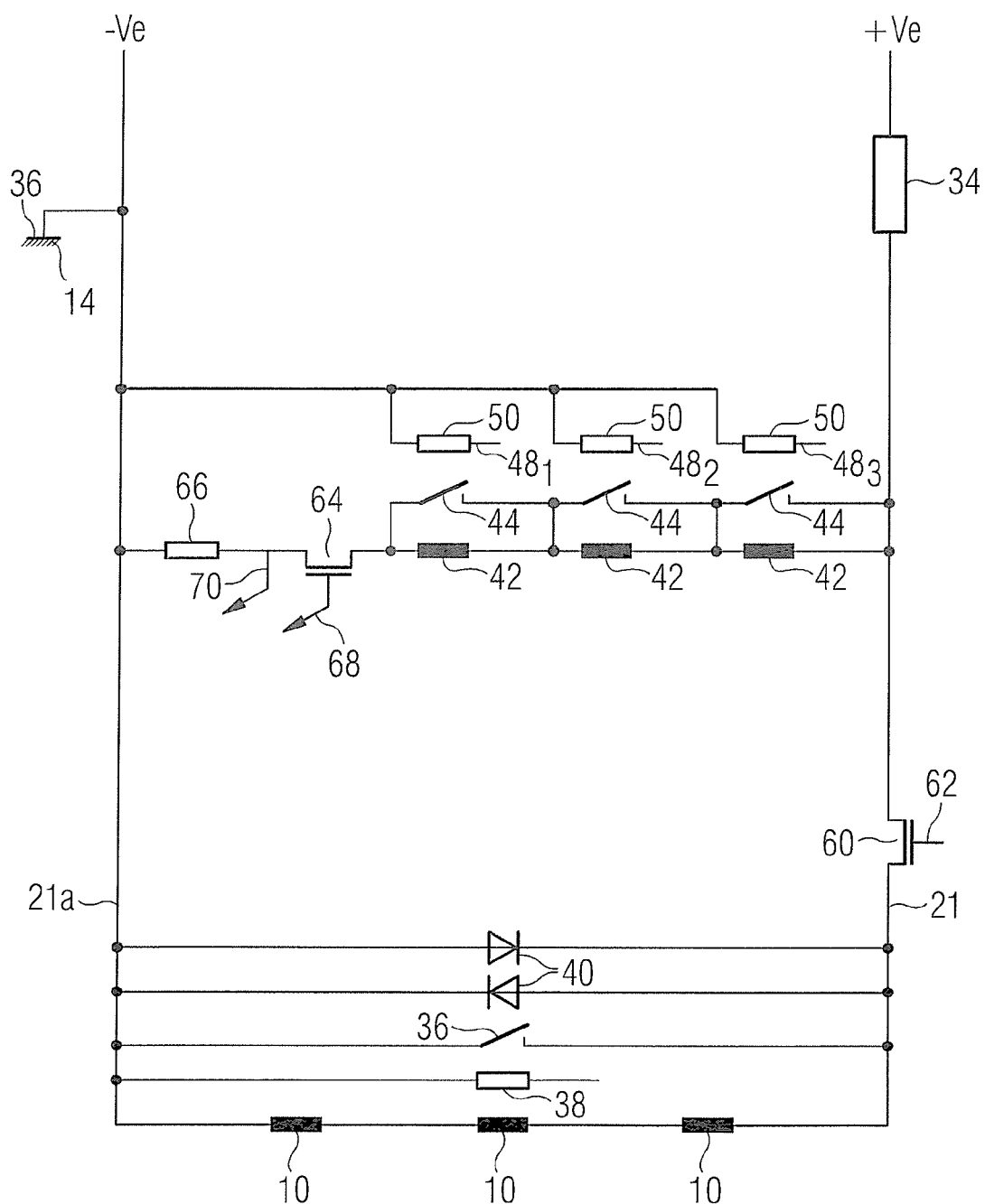
FIG. 6 illustrates an electrical schematic of an embodiment of the present invention, in which superconducting shim coils are employed.

FIG. 6 illustrates an electrical schematic of another embodiment of the present invention. Features corresponding to features of earlier drawings carry corresponding reference numbers. Solid-state switching device 60 such as a power MOSFET is provided in series between the magnet coils 10 and the external current lead 34. A control terminal 62, such as the gate of a power MOSFET, is provided to receive a switching control signal, as described above.

The superconducting shim coils 42 are connected to receive current from the external current lead 34. Only three shim coils 42 are shown for clarity, although it is envisaged that rather more than three would be provided in any particular superconducting magnet for MRI imaging.

The superconducting shim coils 42 are connected in a series arrangement with a solid-state switching device 64, such as a power MOSFET, and preferably also a current sense resistor 66. This series arrangement is connected between the positive current connection 21 and the negative current connection 21a. For each superconducting shim coil 42, a corresponding superconducting switch 44 is connected in parallel, and comprises a heater 50 activated by a control lead 48, as described above.

In this embodiment of the present invention, the various superconducting shim coils 42 are energized sequentially.

Once the magnet coils 10 have been energized, their magnetic field measured, and appropriate shim current calculated, switching device 60 is opened to isolate the magnet coils 10 from the external current lead 34. The external current lead 34 then becomes available for energizing the shim coils 42. Appropriate shim currents may now be introduced into the superconducting shim coils 42.

For sequential energization, one of the shim coils 42 is selected for energization. The corresponding superconducting switch 44 is turned OFF by energization of the corresponding resistor 50 through its control lead 48. The superconducting switches 44 in parallel with each of the remaining shim coils remain ON. A suitable voltage is then applied to external current lead 34. Then, the conductance of the solid-state switching device 64 is adapted by applying suitable control voltage to its control terminal 68. The control voltage applied to solid-state switching device 64 is adjusted until a desired current is flowing in the selected superconducting shim coil 42, as indicated by a voltage at current sense lead 70. The superconducting switch 44 in parallel to the selected superconducting shim coil is then turned ON. The voltage applied to the external current lead 34 may be removed.

A similar sequence may be used to introduce appropriate currents into the remaining superconducting shim coils 42, one at a time.

In this embodiment, solid-state switching device 64, such as a power MOSFET, is used in a linear mode, such that the conductance of the device 64 may be controlled in an analogue manner between a high-conductance "ON" state and a low-conductance "OFF" state by application of suitable control voltages to control terminal 68, to achieve the desired current in each of the shim coils 42.

In this arrangement, the polarity of the voltage applied to the current lead 34, and so the direction of current flowing through it, may be changed as required for setting currents through the shim coils as desired.

Using the methods and apparatus of the present invention, it is possible to carry out shimming at field. Even if multiple iterations are required, they may be performed relatively rapidly, allowing a fast overall shimming operation of the magnet.

The present invention provides arrangements and methods for introducing shim currents into superconducting shim coils, using the same external current lead as is used for introducing current into the magnet coils. The magnet coils are disconnected from the external current lead after current has been introduced into them—known as 'ramping up'—to allow use of the current lead for setting currents in the superconducting shim coils. This has no effect on the operation of the magnet coils 10, or the magnetic field produced by them. Solid-state switching devices such as those discussed above may be used to disconnect the shim coils from the external current lead once shimming is complete. No further fixed current leads or demountable current leads are required beyond those present for introducing current into the magnet coils. The power supply necessarily provided for supplying current to the magnet coils 10 may be used to supply current to the shim coils. Alternatively, a separate power supply may be provided for the shim coils.

While the present invention has been described with reference to a limited number of examples, numerous variants and modifications will be apparent to those skilled in the relevant art. For example, arrangements of shim coils other than those presented may be employed and used within the scope of the appended claims. In some embodiments, a number of shim coils may be provided electrically in series, as shown in FIG. 6, while others may be provided electrically in parallel, as shown in FIG. 5.

While current connections have been referred to above as "positive" or "negative", these terms are used as convenient reference labels only, and their functions may be reversed. For example, the more positive of the current connections may be grounded to the body of the OVC, while external current lead 34 may be connected to provide a negative voltage to the magnet coils 10 through a solid-state switching device.

Arrangements may be made to use the present invention to set the current in each superconducting shim coil individually, as described above; or arrangements may be made to set all superconducting shim coils to a default value or set of values used for different imaging scenarios. As the shimming arrangement and method of the present invention allows very rapid shimming, it is possible to adjust the current in the shim coils to change the shape of the imaging region where necessary for a particular imaging task, by altering the region over which the magnetic field is tolerably homogeneous. Such user-adjustable field of view may be found particularly useful when applied to high field magnets.

Any of the above-described methods for setting currents in superconducting shim coils according to the present invention may be implemented in a computer. A general-purpose computer, or a computer specifically designed for the task, is connected to sensors enabling it to measure homogeneity of a magnetic field within an imaging region. It then performs a computer simulation to calculate currents which when applied to respective shim coils 42 will improve the homogeneity of the magnetic field in the imaging region and adjusts the current flowing in each of the superconducting shim coils so as to achieve a desired homogeneity of the magnetic field in the imaging region, by controlling the current supplied by a power supply connected to provide current to the superconducting shim coils and/or by controlling the conductivity of solid-state switching devices 64 in series with the shim coils. Preferably, the homogeneity of the resultant magnetic field in the imaging region 32 is again measured. A further computer simulation is then performed to calculate currents which when applied to respective shim coils 42 will further improve the homogeneity of the magnetic field in the imaging region, and the current in the shim coils adjusted accordingly. This procedure may be iterated a number of times until a desired, or best possible homogeneity is achieved.

While the described embodiments illustrate a number of signal connections in use within the OVC, as current sense connections, switching device control connections and superconducting switch heater control connections, multiplexing arrangements, known in themselves, may be employed to reduce the number of wires which must be led outside of the OVC, and so reduce the heat leakage produced by such wires.

Notably, the solid-state switching devices 60, 64 are not part of any superconducting circuit and therefore do not need to be located close to the superconducting magnet coils 10 or superconducting shim coils 42, and so can be conveniently located near an access turret, so that such switching devices may be replaced, if necessary, without dismantling the whole OVC.

Although modifications and changes may be suggested by those skilled in the art, it is the intention of the inventor to embody within the patent warranted hereon all changes and modifications as reasonably and properly come within the scope of his contribution to the art.

I claim as my invention:

1. An apparatus for shimming a superconducting magnet, the superconducting magnet comprising a number of magnet coils electrically connected in series between a first current connection and a second current connection and a superconducting switch connected in parallel with the magnet coils, between the first current connection and the second current connection, the first current connection being electrically connected to an external current lead, the apparatus for shimming comprising:
   superconducting a first solid-state switching device electrically interposed between the external current lead and the magnet coils;
   a number of superconducting shim coils electrically connected between the first current connection and the second current connection through a further solid-state switching device;
   switches, each connected in parallel with a respective superconducting shim coil; and
   each superconducting shim coil being electrically connected in series with a respective solid-state switching device, and each series combination of superconducting shim coil and respective solid-state switching device being connected between the first current and the second current connection.

2. An apparatus for shimming a superconducting magnet according to claim 1, wherein a current sensing resistor is electrically in series with the further solid-state switching device.

3. An apparatus according to claim 2 wherein the superconducting shim coils are connected in series with the current sensing resistor and the solid-state switching device.

4. An apparatus according to claim 1, wherein each series combination further comprises a current sensing resistor connected in series.

5. An apparatus according to claim 1, further comprising inverse-parallel connected diodes, connected between the first current connection and the second current connection.

6. A method for shimming a superconducting magnet comprising a number of magnet coils electrically connected in series between a first current connection and a second current connection and a first superconducting switch connected in parallel with the magnet coils, between the first current connection and the second current connection, the first current connection being electrically connected to a fixed current connection, said method comprising:
   electrically connecting a first solid-state switching device between the external current lead and the magnet coils;
   electrically connecting a number of superconducting shim coils between the first current connection and the second current connection through a further solid-state switching device;
   connecting each of further superconducting switches in parallel with a respective superconducting shim coil;
   turning ON the first solid-state switching device and turning OFF the further solid-state switching device;
   turning OFF the first superconducting switch;
   introducing current into the magnet coils through the external current lead and the second current connection;
   turning ON the first superconducting switch;
   turning OFF the first solid-state switching device;
   turning ON a selected further solid-state switching device;
   turning OFF a selected one of said further superconducting switches, in parallel with a selected shim coil, said selected shim coil being in series with the selected further solid-state switching device;

introducing, through the external current lead and the second current connection, a desired current into the selected shim coil;

turning ON the selected further superconducting switch; and repeating the preceding four steps for each of the superconducting shim coils.

7. A method for shimming a superconducting magnet according to claim 6, further comprising monitoring current flowing in each shim coil as current is introduced, and closing the selected further superconducting switch when a desired current is reached for each superconducting shim.

8. A method for shimming a superconducting magnet comprising a number of magnet coils electrically connected in series between a first current connection and a second current connection and a first superconducting switch connected in parallel with the magnet coils, between the first current connection and the second current connection, the first current connection being electrically connected to a fixed current connection, said method comprising:

electrically connecting a first solid-state switching device between the external current lead and the magnet coils;

electrically connecting each of a number of superconducting shim coils between the first current connection and the second current connection through a respective further solid-state switching device;

connecting each of further superconducting switches in parallel with a respective superconducting shim coil;

turning ON the first solid-state switching device and turning OFF the further solid-state switching devices;

turning OFF the first superconducting switch;

introducing current into the magnet coils through the external current lead and the second current connection;

turning ON the first superconducting switch;

turning OFF the first solid-state switching device;

controlling the conductivity of one or more selected further solid-state switching devices which are in series with selected shim coils;

turning OFF further superconducting switches that are parallel with the selected shim coils;

introducing, through the external current lead and the second current connection, a desired current into the selected shim coils, said current being distributed between the selected shim coils according to the relative controlled conductivities of the corresponding selected further solid-state switching devices; and turning ON the selected further superconducting switches.

9. A method for shimming a superconducting magnet according to claim 8, further comprising monitoring the amount of current flowing in the or each selected shim coil while the associated further superconducting switches are turned OFF, and controlling the conductivity of one or more selected further solid-state switching devices to achieve a required level of current in each selected shim coil.

10. A method of shimming a superconducting magnet according to claim 1 further comprising the steps of measuring the homogeneity of a magnetic field within an imaging region of the superconducting magnet and iteratively adjusting the current flowing in each of the superconducting shim coils so as to achieve a desired homogeneity of the magnetic field in the imaging region.

* * * * *